United States Patent
Li et al.

(10) Patent No.: US 9,575,256 B2
(45) Date of Patent: Feb. 21, 2017

(54) OPTICAL REFLECTOR BASED ON A DIRECTIONAL COUPLER AND A COUPLED OPTICAL LOOP

(71) Applicant: Oracle International Corporation, Redwood Shores, CA (US)

(72) Inventors: Guoliang Li, San Diego, CA (US); Xuezhe Zheng, San Diego, CA (US); Ying Luo, San Diego, CA (US); Ashok V. Krishnamoorthy, San Deigo, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/163,591

(22) Filed: May 24, 2016

(65) Prior Publication Data
US 2016/0266320 A1    Sep. 15, 2016

Related U.S. Application Data

(62) Division of application No. 14/875,521, filed on Oct. 5, 2015, now Pat. No. 9,429,812, which is a division of
(Continued)

(51) Int. Cl.
*G02B 6/293* (2006.01)
*G02B 6/12* (2006.01)
(Continued)

(52) U.S. Cl.
CPC ....... *G02B 6/29389* (2013.01); *G02B 6/12007* (2013.01); *G02B 6/293* (2013.01); *G02B 6/29331* (2013.01); *G02B 6/29335* (2013.01); *G02B 6/29338* (2013.01); *G02B 6/29343* (2013.01); *G02B 6/29344* (2013.01); *G02B 6/29352* (2013.01); *G02B 6/29395* (2013.01);
(Continued)

(58) Field of Classification Search
CPC . G02B 6/29389; G02B 6/29331; G02B 6/125; G02B 6/29343; G02B 6/29338; G02B 6/29335; G02B 6/29344; G02B 6/29352; G02B 6/29395; G02F 1/225; G02F 1/0147; G02F 1/2257; H01S 5/0265; H01S 5/2027; H01S 5/3013; H01S 5/50; H01S 5/18; H01S 5/141; H01S 5/02252
USPC    385/14–16, 135–139, 147, 30–32; 250/250; 359/359
See application file for complete search history.

(56) References Cited

U.S. PATENT DOCUMENTS 7,577,328 B2 *    8/2009   Miyadera .............   G02B 6/2813
                                                         385/47
9,176,280 B2 *   11/2015   Li .......................   G02B 6/29331
(Continued)

*Primary Examiner* — Akm Enayet Ullah
(74) *Attorney, Agent, or Firm* — Park, Vaughan, Fleming & Dowler LLP

(57) ABSTRACT

An optical device includes an optical reflector based on a coupled-loopback optical waveguide. In particular, an input port, an output port and an optical loop in arms of the optical reflector are optically coupled to a directional coupler. The directional coupler evanescently couples an optical signal between the arms. For example, the directional coupler may include: a multimode interference coupler and/or a Mach-Zehnder Interferometer (MZI). Moreover, destructive interference during the evanescent coupling determines the reflection and transmission power coefficients of the optical reflector.

9 Claims, 9 Drawing Sheets

Related U.S. Application Data application No. 14/059,282, filed on Oct. 21, 2013, now Pat. No. 9,176,280.

(51) Int. Cl.
| | |
|---|---|
| *H01S 5/14* | (2006.01) |
| *H01S 5/30* | (2006.01) |
| *H01S 5/20* | (2006.01) |
| *H01S 5/50* | (2006.01) |
| *G02F 1/225* | (2006.01) |
| *H01S 5/022* | (2006.01) |
| *G02F 1/01* | (2006.01) |
| *H01S 5/026* | (2006.01) |
| *G02F 1/21* | (2006.01) |
| *H01S 5/18* | (2006.01) |
| *G02B 6/125* | (2006.01) |

(52) U.S. Cl.
CPC ............ *G02F 1/0147* (2013.01); *G02F 1/225* (2013.01); *G02F 1/2257* (2013.01); *H01S 5/0265* (2013.01); *H01S 5/02252* (2013.01); *H01S 5/141* (2013.01); *H01S 5/2027* (2013.01); *H01S 5/3013* (2013.01); *H01S 5/50* (2013.01); *G02B 6/125* (2013.01); *G02F 2001/212* (2013.01); *G02F 2001/217* (2013.01); *H01S 5/18* (2013.01)

(56) References Cited

U.S. PATENT DOCUMENTS

| | | | |
|---|---|---|---|
| 9,429,812 B2* | 8/2016 | Li | G02B 6/29331 |
| 2008/0001062 A1* | 1/2008 | Gunn | G02B 6/12007 |
| | | | 250/206 |
| 2013/0016423 A1* | 1/2013 | Zheng | H01S 5/142 |
| | | | 359/344 |
| 2013/0016744 A1* | 1/2013 | Li | B82Y 20/00 |
| | | | 372/20 |
| 2014/0126603 A1* | 5/2014 | Della-Pergola | H01S 3/08 |
| | | | 372/96 |
| 2014/0133511 A1* | 5/2014 | Tanaka | H01S 5/0687 |
| | | | 372/50.11 |
| 2016/0013609 A1* | 1/2016 | Doerr | H01S 3/10015 |
| | | | 372/20 |
| 2016/0204578 A1* | 7/2016 | Li | H01S 5/021 |
| | | | 372/20 |

\* cited by examiner

OPTICAL REFLECTOR BASED ON A DIRECTIONAL COUPLER AND A COUPLED OPTICAL LOOP

RELATED CASES

This application is a divisional application of, and hereby claims priority under 35 U.S.C. §120 to, pending U.S. patent application Ser. No. 14/875,521, entitled "Optical Reflector Based on a Directionally Coupled Optical Loop," by inventors Guoliang Li, Xuezhe Zheng, Ying L. Luo and Ashok V. Krishnamoorthy, filed on 5 Oct. 2015. U.S. patent application Ser. No. 14/875,521 is itself a divisional application of, and hereby claims priority under 35 U.S.C. §120 to, U.S. patent application Ser. No. 14/059,282, entitled "Optical Reflector Based on a Directionally Coupled Optical Loop," by inventors Guoliang Li, Xuezhe Zheng, Ying L. Luo and Ashok V. Krishnamoorthy, filed on 21 Oct. 2013. The above-referenced applications are hereby incorporated by reference.

GOVERNMENT LICENSE RIGHTS

This invention was made with United States government support under Agreement No. HR0011-08-9-0001 awarded by DARPA. The United States government has certain rights in the invention.

BACKGROUND

Field

The present disclosure generally relates to an optical reflector to facilitate an optical source. More specifically, the present disclosure relates to an optical reflector based on a directionally coupled optical loop with evanescent coupling between arms of the optical loop.

Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low-power (for example, less than 1 pJ/bit) optical interconnect, a high-efficiency optical source, such as a semiconductor laser or a laser source, is typically required. In particular, the required power consumption of the laser source may need to be 0.4 pJ/bit.

One approach to fabricating a high-efficiency optical source is to integrate a III-V material with silicon optical-waveguide devices to form a laser cavity. In such a hybrid optical source, the III-V material provides optical gain, and the silicon optical-waveguide devices control the lasing wavelength and the cavity reflection/transmission. In order to minimize the lasing threshold and/or to maximize the lasing efficiency, the cavity reflection/transmission typically needs to be optimized based on the III-V material gain and the cavity loss. Usually, the cavity reflection/transmission is controlled by a partial optical reflector. However, while existing silicon ring-resonator filters provide excellent narrow-band optical filtering for lasing wavelength control, to date implementing a suitable partial optical reflector typically requires two discrete components (a reflector with high reflectivity and a 2×2 directional coupler) to control cavity reflection and establish output port(s) for the hybrid laser. Moreover, using a separate 2×2 directional coupler usually results in longer cavity length and the laser output is split into two output ports with different power.

Hence, what is needed is an optical reflector without the problems described above.

SUMMARY

One embodiment of the present disclosure provides an optical device. This optical device includes: an optical waveguide that conveys an optical signal, where the optical waveguide includes an optical reflector. The optical reflector includes: an input port optically coupled to a first arm of the optical reflector; an output port optically coupled to a second arm of the optical reflector; a directional coupler optically coupled to the first arm and the second arm, where the directional coupler evanescently couples the optical signal between the first arm and the second arm; and an optical loop optically coupled to the directional coupler, where the optical loop includes a third arm and a fourth arm.

Note that the fourth arm may have a coupling power coefficient of X in the optical loop after the directional coupler and the third arm may have a coupling power coefficient of Y in the optical loop after the directional coupler. Moreover, the input port may have a reflection power coefficient of 4XY and the output port may have a transmission power coefficient of $(X-Y)^2$.

Furthermore, a phase difference between the optical signal in the third arm in the optical loop after the directional coupler and the fourth arm in the optical loop after the directional coupler may be 180° so that destructive interference occurs in the optical loop.

Additionally, the directional coupler may include a multimode interference coupler.

In some embodiments, the optical device includes a Mach-Zehnder Interferometer (MZI) between the input port, the output port and the optical loop, where the MZI includes the directional coupler at one end of the MZI and a second directional coupler at a second end of the MZI. Moreover, the MZI may adjust a transmission power coefficient of the output port. Furthermore, the MZI may receive: a voltage across a pn junction, and/or a current through a pn or a p-i-n junction. Note that the optical device may include a heater that modifies a temperature of at least a portion of the MZI.

Moreover, the optical device may include one or more ring-resonator filters in the optical loop. For example, the one or more ring-resonator filters may be between the first arm and the input port.

Another embodiment provides a hybrid optical source. This hybrid optical source includes: an optical amplifier that provides an optical signal having a range of wavelengths; a semiconductor reflector, mechanically and optically coupled to the optical amplifier, which reflects the optical signal over the range of wavelengths to change a direction of propagation of the optical signal; and a semiconductor-on-insulator (SOI) chip optically coupled to the optical amplifier. The SOI chip includes: a substrate; an oxide layer disposed on the substrate; and a semiconductor layer disposed on the oxide layer and having a surface facing the optical amplifier. Moreover, the semiconductor layer includes: an optical waveguide that conveys the optical signal; and the optical reflector that at least partially reflects a wavelength in the optical signal. Note that the optical amplifier, the semiconductor reflector, the optical coupler, the optical waveguide and the optical reflector define an optical cavity in the hybrid optical source.

Furthermore, the optical amplifier may include a semiconductor optical amplifier. For example, the semiconductor optical amplifier may include a III-V semiconductor.

Additionally, the reflected wavelength of the optical reflector may be tunable.

Another embodiment provides a system that includes: a processor; memory; and an optical integrated circuit that includes an optical device. The optical device includes: an optical waveguide that conveys an optical signal, where the optical waveguide includes the optical reflector.

Another embodiment provides a method for reflecting the wavelength in the optical signal. During the method, the optical signal having the range of wavelengths is output from the optical amplifier. Then, the optical signal is conveyed using the optical waveguide. Next, the wavelength in the optical signal is at least partially reflected using the optical reflector.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical device, a hybrid optical source that includes the optical device, a system that includes the optical device, and a method for reflecting a wavelength in an optical signal are described. This optical device includes an optical reflector based on a coupled-loopback optical waveguide. In particular, an input port, an output port and an optical loop in arms of the optical reflector are optically coupled to a directional coupler. The directional coupler evanescently couples an optical signal between the arms. For example, the directional coupler may include: a multimode interference coupler and/or a Mach-Zehnder Interferometer (MZI). Moreover, destructive interference during the evanescent coupling determines the reflection and transmission coefficients of the optical reflector.

By partially reflecting the optical signal, the optical reflector provides a more-compact optical device with reduced optical loss. This optical device can be used to implement a high-efficiency hybrid optical source, such as a semiconductor laser or a laser source. Consequently, the optical device may facilitate high-performance optical interconnects for use in applications such as high-performance computing.

We now describe embodiments of the optical device. This optical device includes an optical reflector (which can be a partial optical reflector) based on a coupled loopback optical waveguide. The reflection and transmission power coefficients of the optical reflector can be controlled and tuned by selecting (during the design) or adjusting (during operation of the optical reflector) the coupling power coefficient of the loopback optical waveguide.

Figure 1:
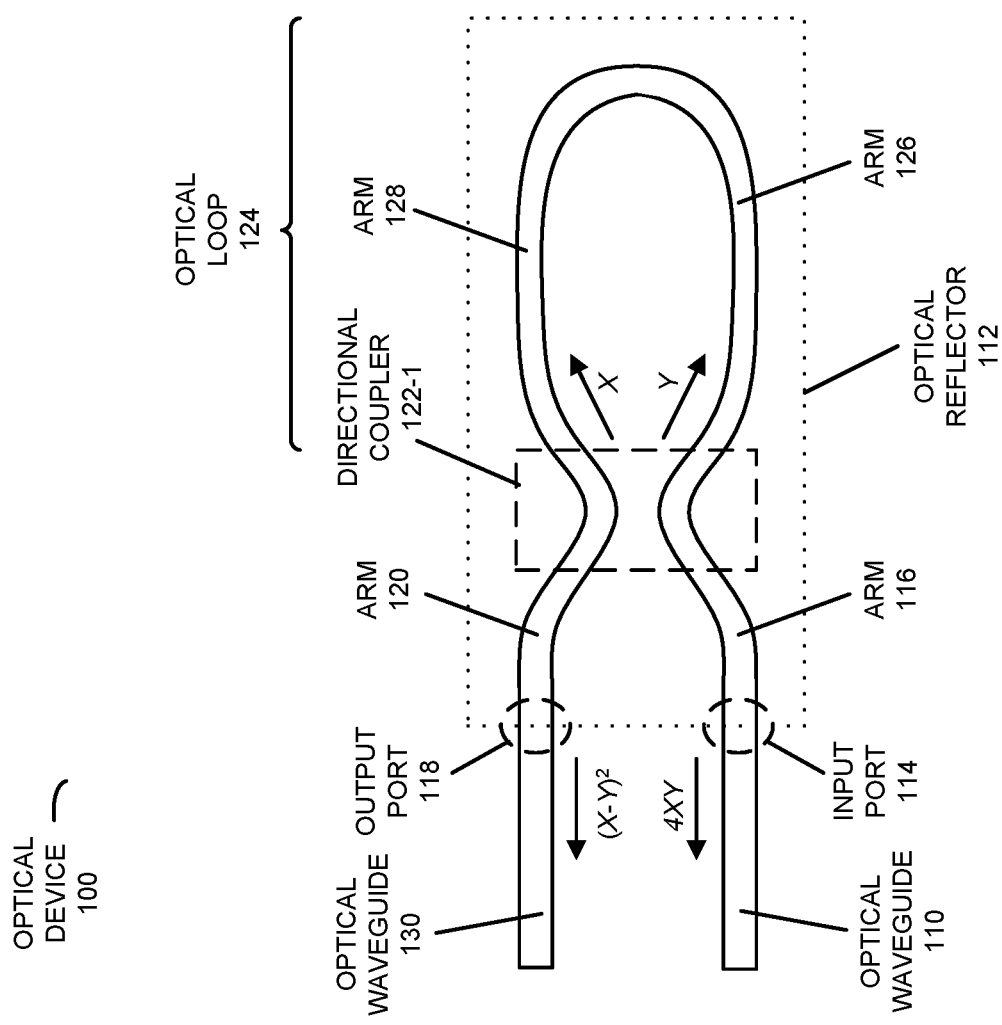
FIG. 1 is a block diagram illustrating an optical device in accordance with an embodiment of the present disclosure.

FIG. 1 presents a block diagram illustrating an optical device 100. This optical device includes: an optical waveguide 110 that conveys an optical signal, where optical waveguide 110 includes an optical reflector 112. Optical reflector 112 includes: an input port 114 optically coupled to an arm 116 of optical reflector 112; an output port 118 optically coupled to an arm 120 of optical reflector 112; a directional coupler 122-1 optically coupled to arms 116 and 120, where directional coupler 122-1 evanescently couples the optical signal between arms 116 and 120; and an optical loop 124 optically coupled to directional coupler 122-1, where optical loop 124 includes arms 126 and 128.

Note that arm 128 may have a coupling power coefficient of X from the input port in optical loop 124 after directional coupler 122-1 and arm 126 may have a coupling power coefficient of Y in optical loop 124 after directional coupler 122-1. In particular, if directional coupler 122-1 has a coupling power coefficient X, then arm 128 has a field amplitude of $$\sqrt{X} \cdot \exp\left(\frac{i\pi}{2}\right),$$

and arm 126 has a field amplitude of $$\sqrt{Y},$$

where Y equals 1−X (assuming negligible excess loss from the directional coupler). As shown in FIG. 1, arms 126 and 128 are looped back to each other and their power will be coupled back to arms 116 and 120. Note that the two counter-propagating waves in the loopback optical waveguide (i.e., optical loop 124) experience identical optical path and phase. (However, a phase difference between the optical signal in arm 126 in optical loop 124 after directional coupler 122-1 and in arm 128 in optical loop 124 after directional coupler 122-1 may be 180° so that destructive interference occurs in optical loop 124.) The reflection power coefficient of the power reflected into (input) optical waveguide 110 is therefore $$P_R = |\sqrt{X} \cdot e^{i\pi/2} \sqrt{Y} + \sqrt{Y} \cdot \sqrt{X} \cdot e^{i\pi/2}|^2 = 4 \cdot X \cdot Y.$$

Moreover, the transmission power coefficient of the power coupled into (output) optical waveguide 130 is $$P_O = |\sqrt{X} \cdot e^{i\pi/2} \sqrt{X} \cdot e^{i\pi/2} + \sqrt{Y} \cdot \sqrt{Y}|^2 = (X-Y)^2.$$

Note that the sum of $P_R$ and $P_O$ equals one.

In some embodiments, directional coupler 122-1 includes a multimode interference coupler (which is a type of evanescent coupler). A multimode interference coupler may provide a broad wavelength band and tolerance to fabrication errors. However, a multimode interference coupler is typically used for 3 dB coupling (i.e., X equal to 0.5). It may be difficult to design a low-loss multimode interference coupler with a different coupling power coefficient X.

Figure 2:
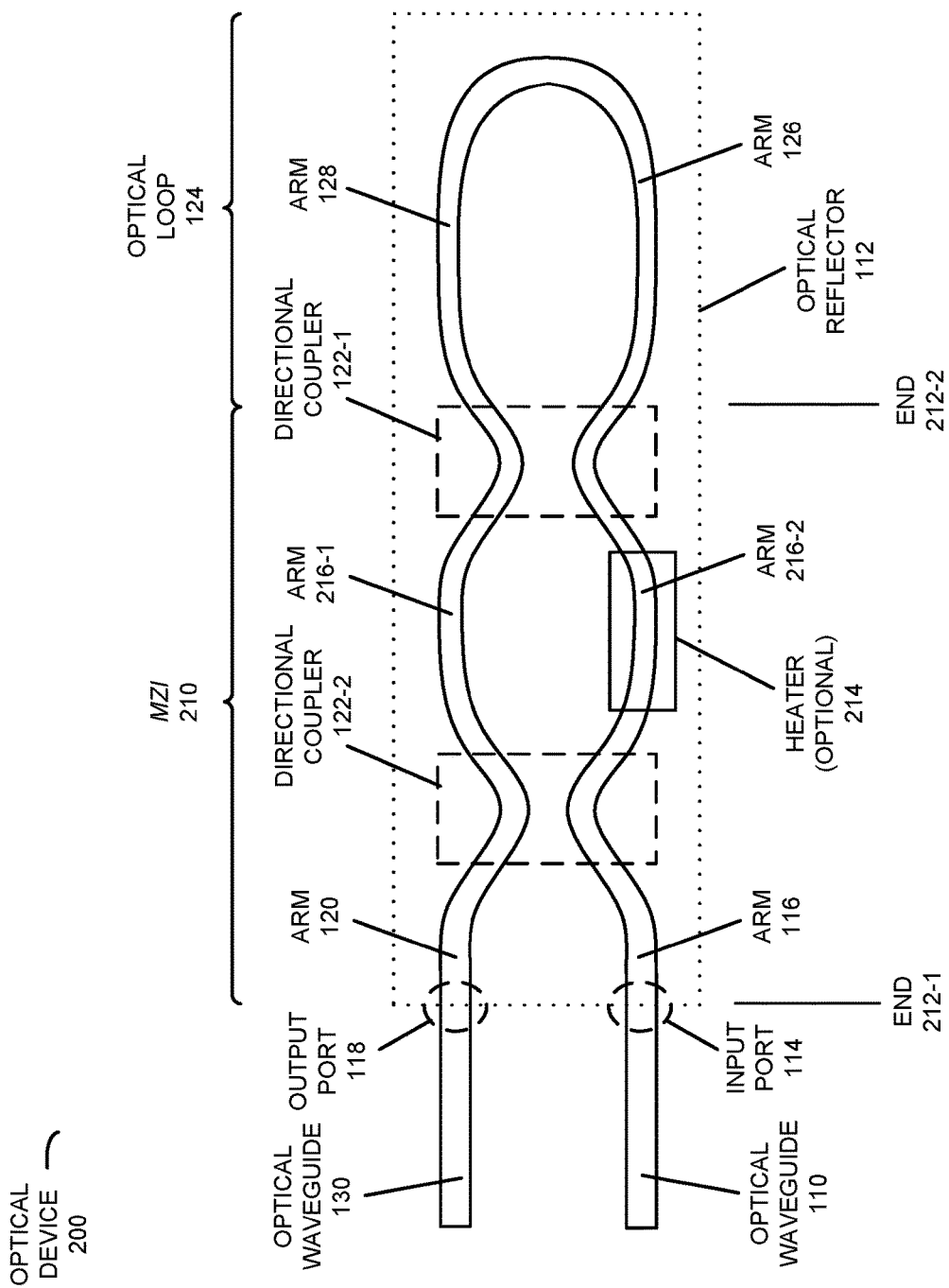
FIG. 2 is a block diagram illustrating an optical device that includes a Mach-Zehnder Interferometer (MZI) in accordance with an embodiment of the present disclosure.

Alternatively, as shown in FIG. 2, which presents a block diagram illustrating an optical device 200, directional coupler 122-1 includes a Mach-Zehnder Interferometer (MZI) 210. In particular, MZI 210 includes directional couplers 122 between input port 114, output port 118 and optical loop 124 (e.g., at ends 212 of MZI 210). Note that these directional couplers may each be 3-dB couplers, so they can be replaced by multimode interference couplers.

Moreover, the MZI may adjust a transmission power coefficient of output port 118 (for example, by adjusting the coupling power coefficient X). For example, MZI 210 may receive: a voltage across a pn junction, and/or a current through a pn or a p-i-n junction. (Thus, MZI 210 may be electrically or thermally tuned.) Alternatively or additionally, optical device 200 may include an optional heater 214 that modifies a temperature of at least a portion of MZI 210. The tuning of MZI 210 may adjust the coupling power coefficient X by modifying the phase difference between arms 216 in MZI 210. This tuning may be quasi-static (such as one-time), after a time interval has elapsed, and/or dynamic, and may be used to optimize the performance of optical device 200. In some embodiments, optical device 200 includes a multiple-stage MZI to facilitate operation over an extended wavelength band (such as up to 100 nm).

Additionally, the optical device may include one or more ring-resonator filters. In particular, the optical device may include one or more wavelength-tunable ring-resonators filters that provide very narrow-band wavelength filtering and tuning. As described below with reference to FIG. 7, this capability may be useful for laser cavities in order to achieve single-wavelength lasing and tuning.

Figure 3:
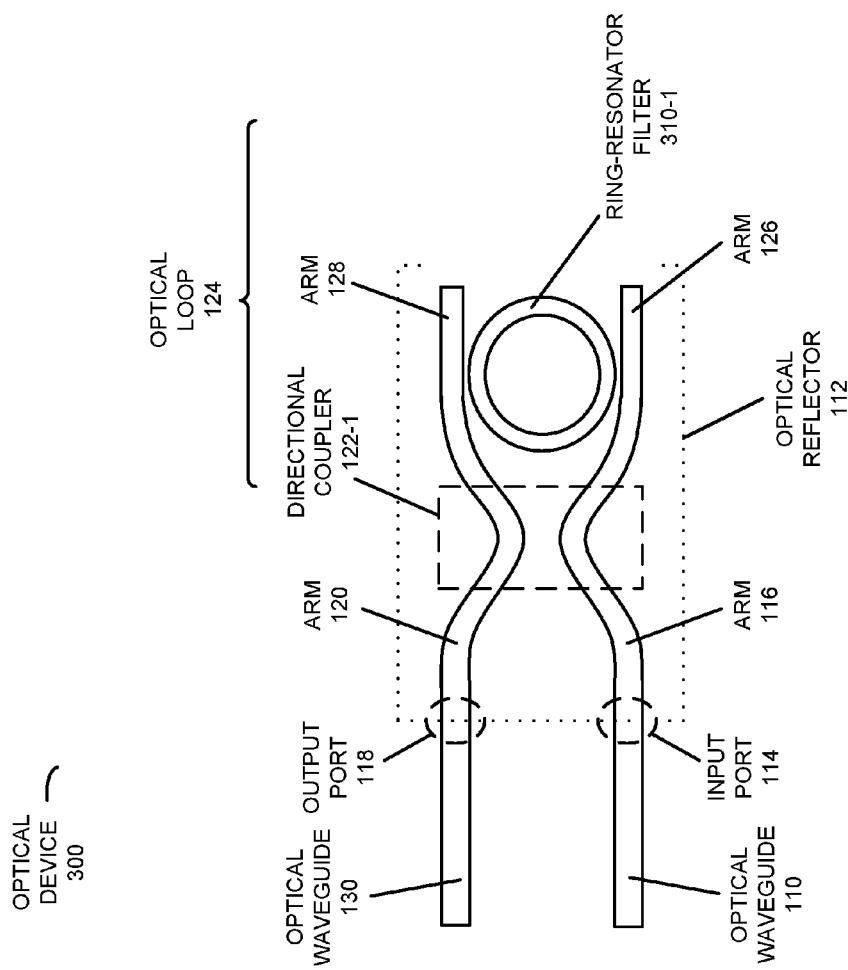
FIG. 3 is a block diagram illustrating an optical device that includes a ring-resonator filter in accordance with an embodiment of the present disclosure.
Figure 4:
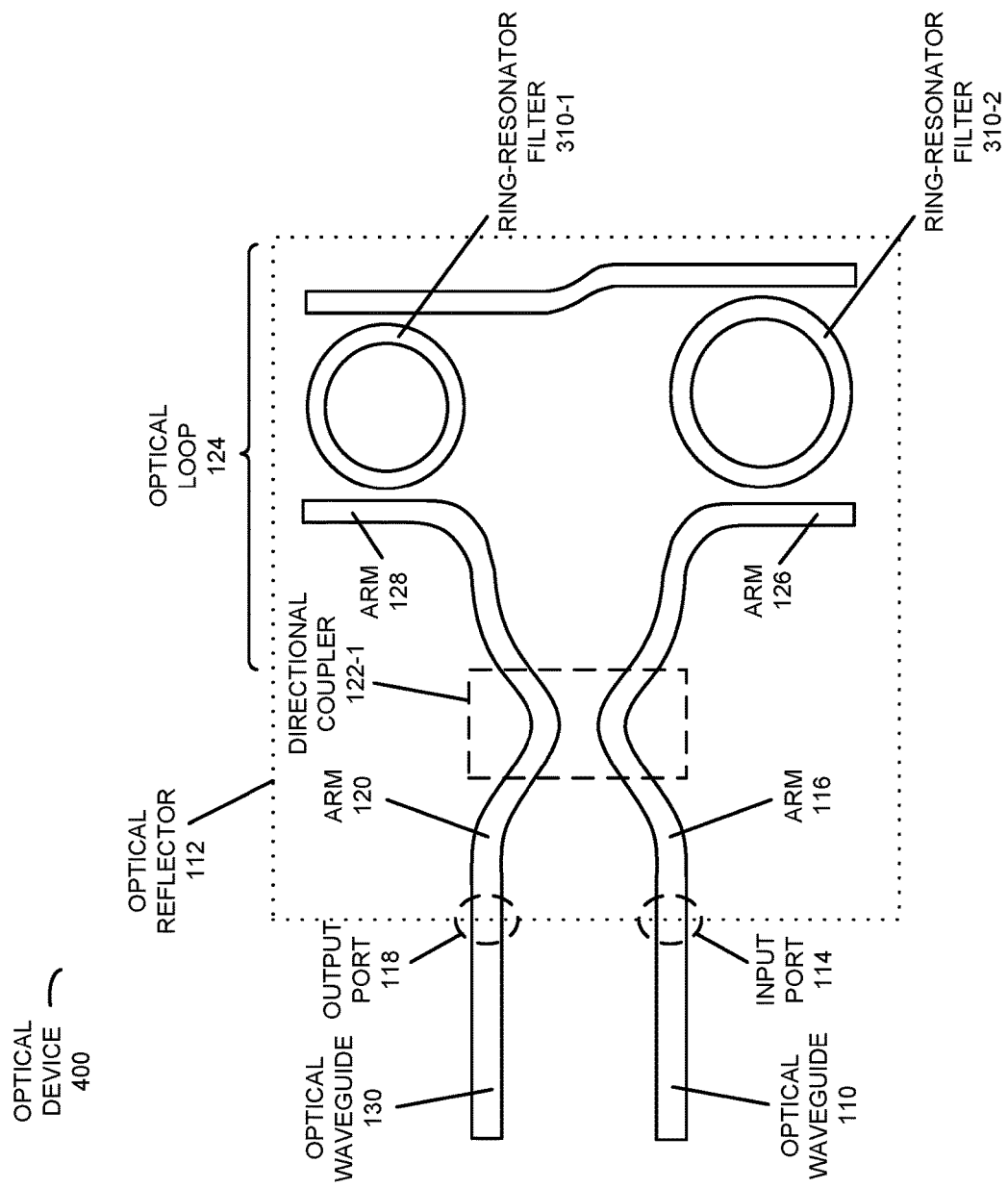
FIG. 4 is a block diagram illustrating an optical device that includes two ring-resonator filters in accordance with an embodiment of the present disclosure.

FIG. 3 presents a block diagram illustrating an optical device 300 that includes a ring-resonator filter 310-1 in the optical loop for loopback and wavelength filtering. Moreover, FIG. 4 presents a block diagram illustrating an optical device 400 that includes Vernier dual ring-resonator filters 310 for loopback and wavelength filtering. Note that these Vernier dual ring-resonator filters may have different ring sizes or radii. This may increase the free spectral range (FSR) of the resonance, which may help ensure single-wavelength lasing even with a broad-gain spectrum.

Figure 5:
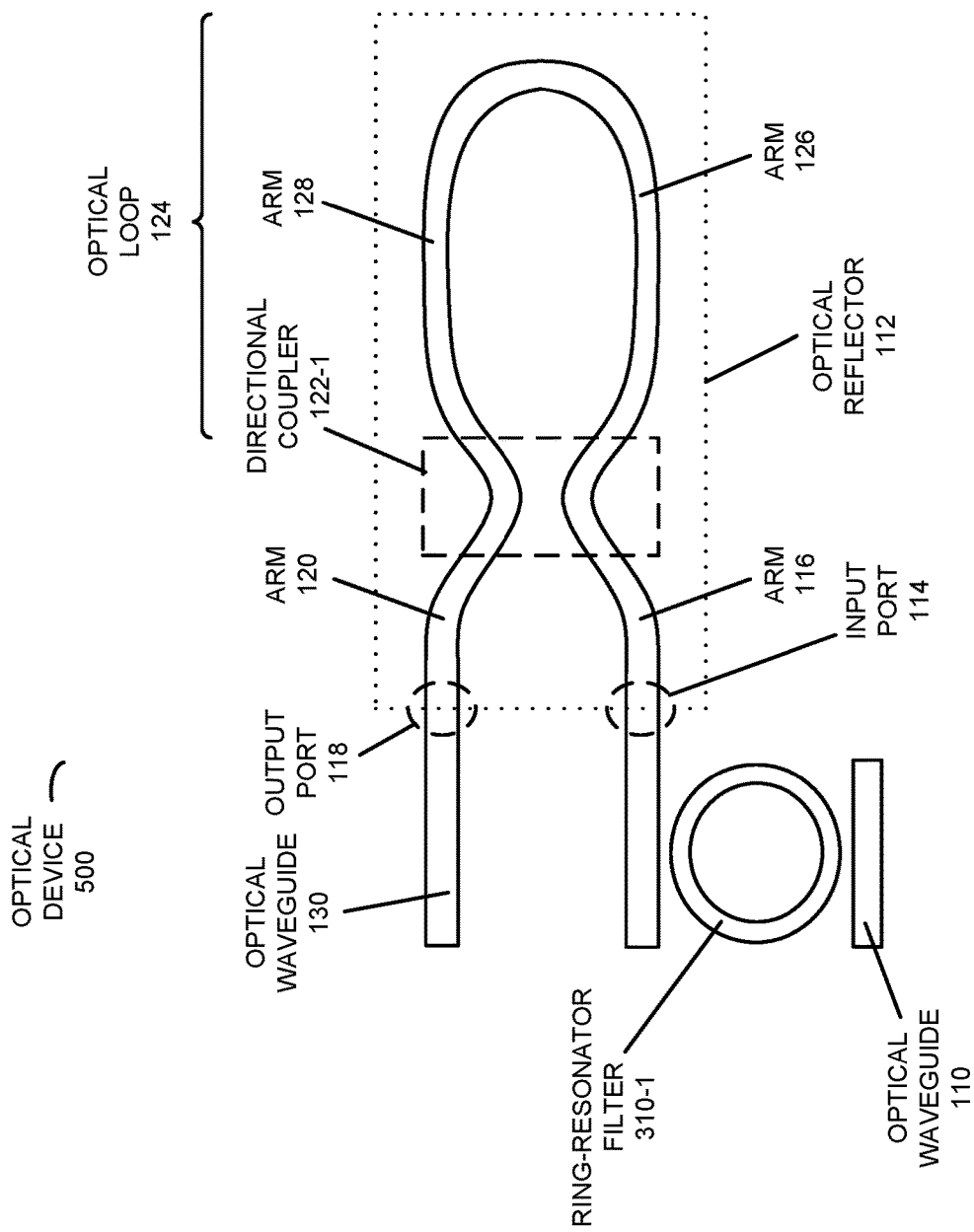
FIG. 5 is a block diagram illustrating an optical device that includes a ring-resonator filter in accordance with an embodiment of the present disclosure.
Figure 6:
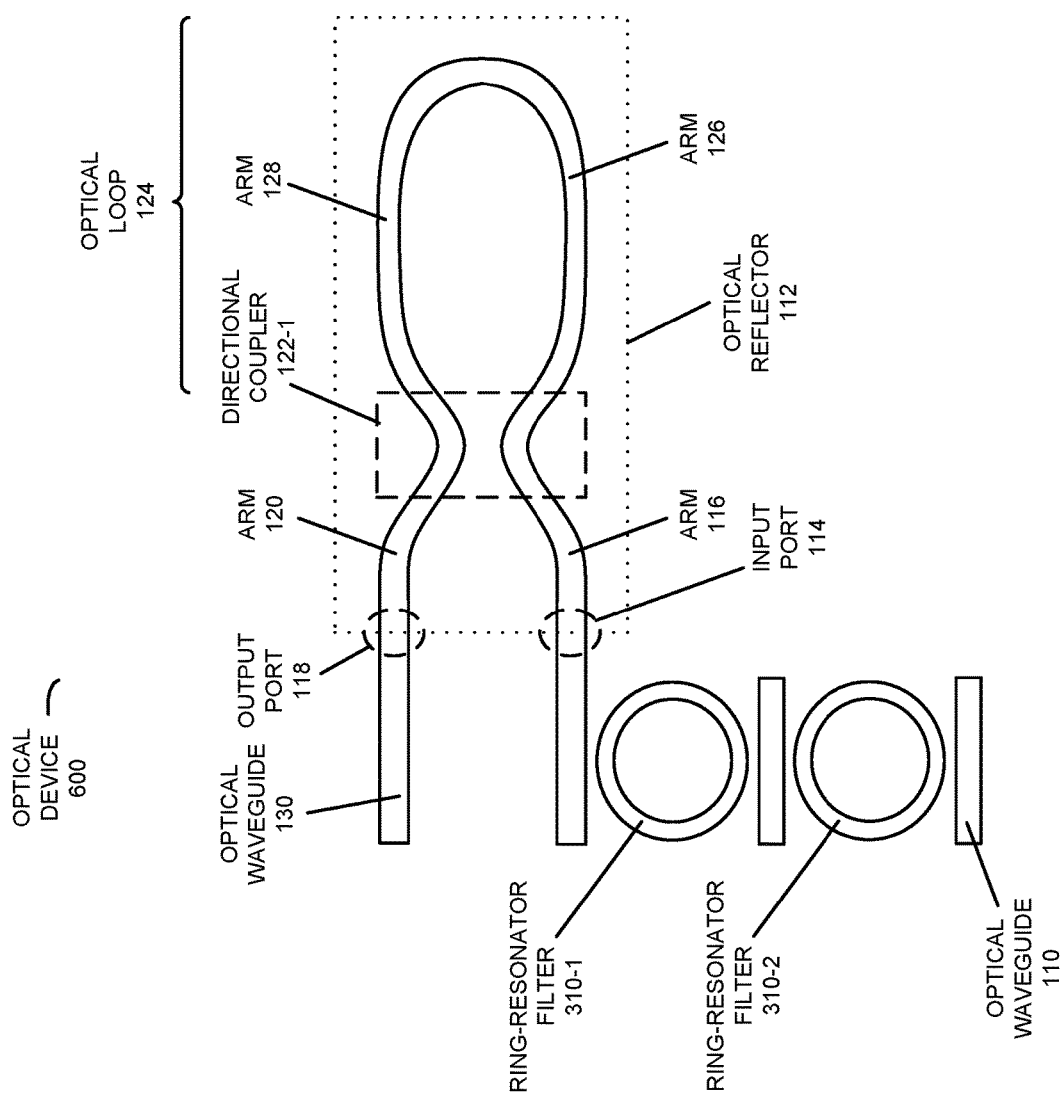
FIG. 6 is a block diagram illustrating an optical device that includes two ring-resonator filters in accordance with an embodiment of the present disclosure.

Alternatively or additionally, the one or more ring-resonator filters may be between arm 116 and input port 114 in FIG. 1. This is shown in FIG. 5, which presents a block diagram illustrating an optical device 500 that includes a ring-resonator filter 310-1. Moreover, as shown in FIG. 6, which presents a block diagram illustrating an optical device 600, Vernier dual ring-resonator filters 310 may be used.

A variety of approaches have been proposed to make an efficient laser source for use in silicon-photonic links. These approaches typically require integration, with low optical losses, of a gain or active medium on an optical-amplifier chip (such as a III-V semiconductor chip, which is sometimes referred to as a 'III-V optical-amplifier chip') with an optical waveguide on a silicon-on-insulator (SOI) chip. One or more of the preceding embodiments of the optical device may be used to provide a partial optical reflector in such a laser source (and, more generally, in an optical source). For example, the optical device may be included in the laser cavity.

Figure 7:
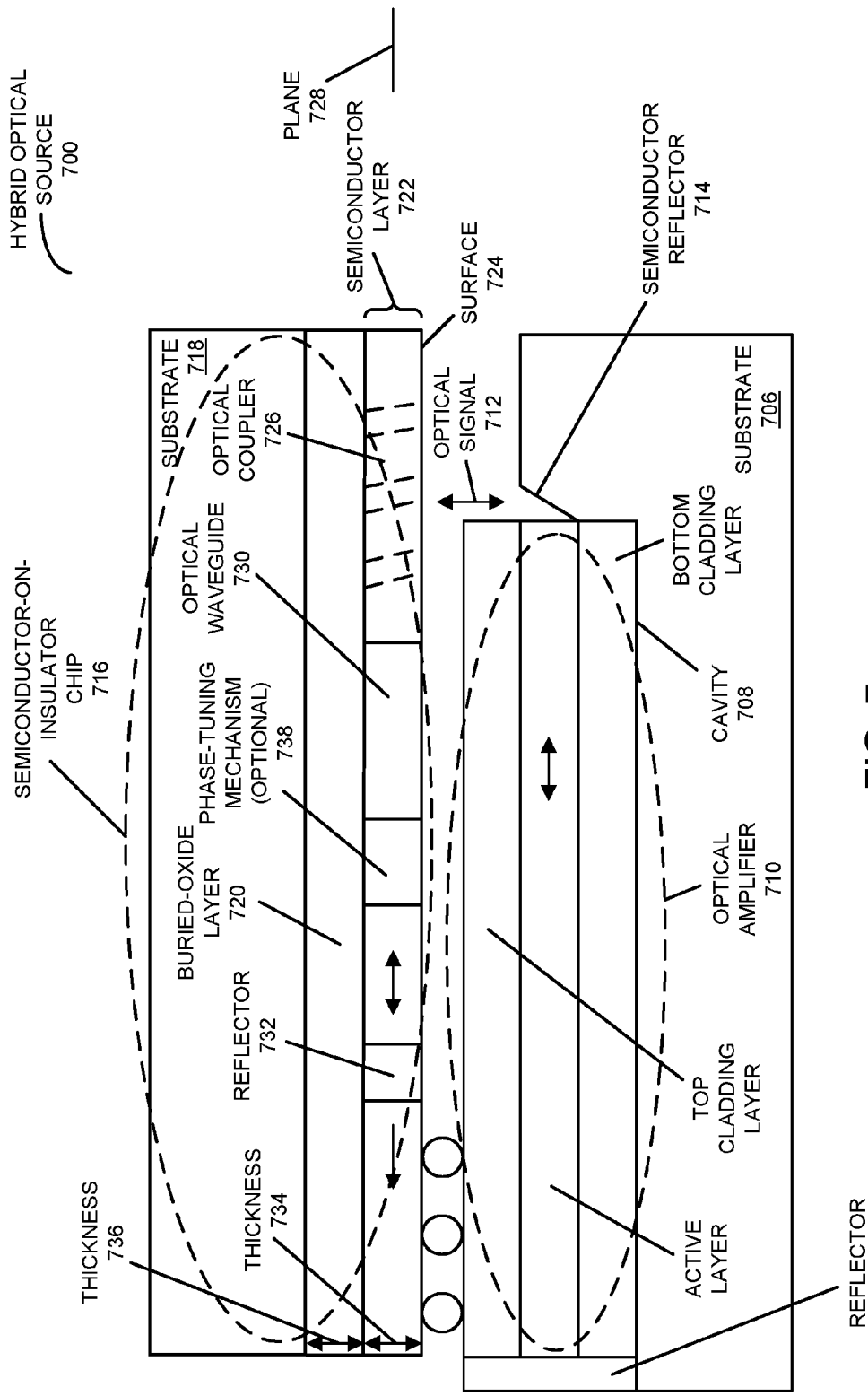
FIG. 7 is a block diagram illustrating a hybrid optical source in accordance with an embodiment of the present disclosure.

In general, the preceding embodiments of the partial reflector can be used to implement a hybrid laser independent of how the gain medium is integrated. Thus, a wide variety of configurations may be used. As an illustration, a specific implementation of the integration of the gain medium is shown in FIG. 7, which presents a block diagram illustrating a hybrid optical source 700. This hybrid optical source includes an edge-emitter optical amplifier 710 that provides an optical signal 712 (or light) having a range of wavelengths. For example, optical amplifier 710 may include a semiconductor optical amplifier (such as a reflective semiconductor optical amplifier or a semiconductor laser) with gain induced by current injection. In some embodiments, the semiconductor optical amplifier includes a III-V semiconductor. Thus, the semiconductor optical amplifier may include an active layer having a band-gap wavelength that exceeds that of silicon.

Moreover, hybrid optical source 700 includes a semiconductor reflector 714, mechanically and optically coupled to optical amplifier 710, which reflects optical signal 712 over the range of wavelengths to change a direction of propagation of optical signal 712. In an exemplary embodiment, semiconductor reflector 714 may include a mirror etched into a semiconductor substrate 706 (such as a mirror etched at 54.7° in silicon) or a cleaved facet with a high-reflectivity coating. This semiconductor reflector may cover the entire range of wavelengths output by a III-V semiconductor optical amplifier.

In some embodiments, semiconductor substrate 706 includes a cavity 708 defined by an edge in a surface of substrate 706, and optical amplifier 710 may be disposed in cavity 708 so that optical amplifier 710 and semiconductor reflector 714 are aligned. For example, semiconductor reflector 714 may be defined by a crystal plane and the registration provided by semiconductor substrate 706 may facilitate a multi-channel optical source. Note that the mirror may be fabricated using a wet-etching technique and the cavity in the semiconductor substrate may be fabricated using a dry-etching technique. However, in other embodiments the mirror etched into semiconductor substrate 706 is independently mechanically coupled to optical amplifier 710. For example, the mirror may be glued onto optical amplifier 710.

Furthermore, hybrid optical source 700 includes a semiconductor-on-insulator chip 716 optically coupled to semiconductor reflector 714. This semiconductor-on-insulator chip may include: a substrate 718; an oxide layer 720 (which is sometimes referred to as a 'buried-oxide layer') disposed on substrate 718; and a semiconductor layer 722 disposed on oxide layer 720 and having a surface 724 facing semiconductor reflector 714. Note that semiconductor layer 722 may include silicon. Thus, in some embodiments semiconductor-on-insulator chip 716 includes an SOI chip and, therefore, is a silicon photonic chip.

Semiconductor layer 722 may include: an optical coupler 726 (such as a diffraction grating or a grating coupler, or a mirror) that redirects optical signal 712 to and from a plane 728 of semiconductor layer 722; an optical waveguide 730 that conveys optical signal 712; and an optical reflector 732 (such as the optical reflector in one of the preceding embodiments of the optical device) that at least partially reflects a wavelength in optical signal 712.

If a first order of the diffraction grating is used to couple the optical signal into and out of plane 728, it may be difficult to fabricate the diffraction grating (for example, the period of the diffraction grating may be 300 nm). Therefore, a diffraction order of the diffraction grating greater than one (such as a diffraction order of two) may be used to couple optical signal 712 into and out of plane 728, and the diffraction grating may have a length less than 75 µm.

Furthermore, the diffraction grating may be at an angle relative to plane 728, where the angle is other than 0 or 90°. For example, the diffraction grating may be a blazed grating with dry etched teeth at the (blaze) angle of 75-85°. Note that the diffraction grating may match semiconductor reflector 714 so that optical signal 712 is directed to and from plane 728. In addition, reflector 732 may include: a ring resonator, a distributed Bragg reflector or a first-order diffraction grating.

In some embodiments, the wavelength reflected by optical reflector 732 may be tunable. For example, optical reflector 732 may be electrically and/or thermally tuned. In particular, based on the material gain and the cavity loss (including the optical-waveguide loss and the coupling loss between the III-V optical-amplifier chip and semiconductor-on-insulator chip 716), the partial reflection of optical reflector 732 may be adjusted for the desired laser performance.

In hybrid optical source 700, optical signal 712 is confined in the waveguides in optical amplifier 710 (i.e., the III-V optical-amplifier chip) and semiconductor-on-insulator chip 716. Optical signal 712 propagates in free-space (or in an equivalently transparent optical material, such as underfill) between the facet of semiconductor reflector 714 and optical coupler 726. Such bidirectional coupling between optical amplifier 710 and optical reflector 732 on semiconductor-on-insulator chip 716 creates a hybrid optical cavity for an external optical-cavity tunable laser source using wavelength-selective optical feedback from circuits on semiconductor-on-insulator chip 716, in which optical amplifier 710 provides optical gain while optical reflector 732 controls the lasing wavelength. Thus, the optical cavity consists of three semiconductor substrates or chips, and includes: optical amplifier 710, semiconductor reflector 714, optical coupler 726, optical waveguide 730 and optical reflector 732.

In this way, hybrid optical source 700 may provide low-loss (high-efficiency, proximity) optical coupling between optical amplifier 710 and semiconductor-on-insulator chip 716 (and, in particular, into optical waveguide 730). The resulting hybrid optical source combines the gain of a III-V semiconductor with the efficient wavelength control of silicon photonics, and thus can provide: a high wall-plug efficiency, a narrow lasing linewidth, a small footprint, low cost and high-yield integration. Consequently, hybrid optical source 700 can be used as an external optical source to provide optical power to a silicon photonic chip, a silicon-photonic interconnect or link, or an optical fiber. For example, hybrid optical source 700 may facilitate a low-power (<1 pJ/bit) silicon-photonic interconnect or link. More generally, hybrid optical source 700 can be used in a wide variety of applications, including communications, welding, medicine, etc.

In an exemplary embodiment, the range of wavelengths of optical signal 712 is between 1.1-1.7 μm. For example, hybrid optical source 700 may be a laser providing optical signal 712 having a fundamental wavelength of 1.3 or 1.55 μm. Moreover, semiconductor layer 722 may have a thickness 734 that is less than 1 μm (such as 0.2-0.3 μm). Furthermore, oxide layer 720 may have a thickness 736 between 0.3 and 3 μm (such as 0.8 μm).

In addition to optical reflector 732, semiconductor-on-insulator chip 716 may provide circuits, devices or components for fixing, tuning, monitoring, and controlling the wavelength of hybrid optical source 700, as well as cooling, to achieve the requisite tuning range, lasing linewidth and feedback control. In some embodiments, semiconductor layer 722 includes an optional phase-tuning mechanism 738 (which may be based on a thermal tuning or carrier-based index modulation) that adjusts the phase of optical signal 712. This phase tuning may ensure that the proper optical-cavity length can be created to ensure coherent resonant feedback at the wavelength.

While FIG. 7 illustrates out-of-plane coupling of optical signal 712 between the III-V optical-amplifier chip and semiconductor-on-insulator chip 716, in other embodiments the hybrid optical source may be implemented using butt-coupling or edge-to-edge coupling.

Figure 8:
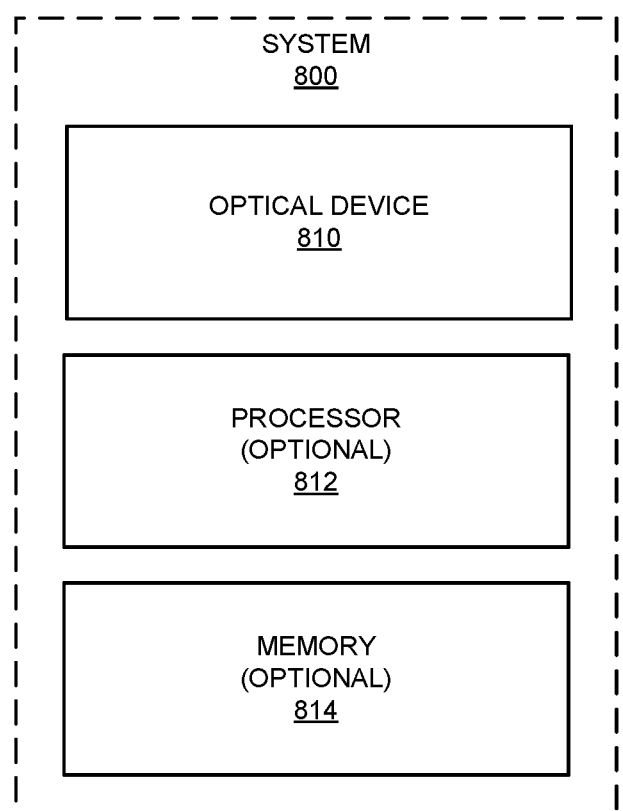
FIG. 8 is a block diagram illustrating a system in accordance with an embodiment of the present disclosure.

We now describe the system. FIG. 8 presents a block diagram illustrating a system 800 that includes: an optical integrated circuit 810 that includes optical device 810 (such as one of the preceding embodiments of the optical device), an optional processor 812, and optional memory 814. The optical device includes: an optical waveguide that conveys an optical signal, where the optical waveguide includes the optical reflector.

System 800 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a workstation, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the optical device, the hybrid optical source and/or the system may include fewer components or additional components. Moreover, the substrates may include: a semiconductor die (such as silicon), a ceramic, an organic material and/or glass.

Although the optical device, the hybrid optical source and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

Note that components in the preceding embodiments of the optical device, the hybrid optical source and the system may be fabricated using a wide variety of techniques, as is known to one of skill in the art.

Figure 9:
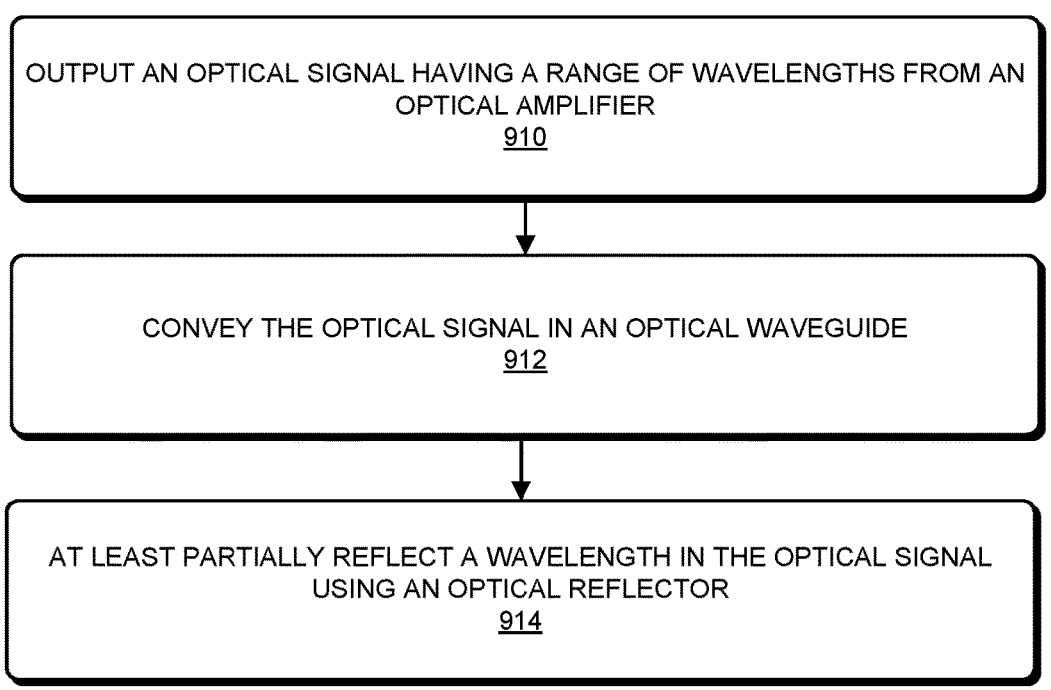
FIG. 9 is a flow diagram illustrating a method for reflecting a wavelength in an optical signal in accordance with an embodiment of the present disclosure.

We now describe the method. FIG. 9 presents a flow diagram illustrating a method 900 for reflecting a wavelength in an optical signal. During the method, the optical signal having the range of wavelengths is output from an optical amplifier (operation 910). Then, the optical signal is conveyed using an optical waveguide (operation 912). Next, the wavelength in the optical signal is at least partially reflected using an optical reflector (operation 914), such as the optical reflector in one of the preceding embodiments of the optical device.

In some embodiments of method 900, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A hybrid optical source, comprising:
    an optical amplifier configured to provide an optical signal having a range of wavelengths;
    a semiconductor reflector, mechanically and optically coupled to the optical amplifier, configured to reflect the optical signal over the range of wavelengths to change a direction of propagation of the optical signal; and
    a semiconductor-on-insulator (SOI) chip optically coupled to the optical amplifier, wherein the SOI chip includes:
        a substrate;
        an oxide layer disposed on the substrate; and
        a semiconductor layer disposed on the oxide layer and having a surface facing the optical amplifier, wherein the semiconductor layer includes:
            an optical waveguide configured to convey the optical signal; and
            an optical reflector configured to at least partially reflect a wavelength in the optical signal, wherein the optical amplifier, the semiconductor reflector, the optical coupler, the optical waveguide and the optical reflector define an optical cavity in the hybrid optical source; and
        wherein the optical reflector includes:
            an input port optically coupled to a first arm of the optical reflector;
            an output port optically coupled to a second arm of the optical reflector;
            a directional coupler optically coupled to the first arm and the second arm, wherein the directional coupler is configured to evanescently couple the optical signal between the first arm and the second arm; and
            an optical loop optically coupled to the directional coupler, wherein the optical loop includes a third arm and a fourth arm;
        wherein a reflection power coefficient at the input port and a transmission power coefficient at the output port are determined based on coupling power coefficients of the third and the fourth arms.

2. The hybrid optical source of claim 1, wherein the optical amplifier includes a semiconductor optical amplifier.

3. The hybrid optical source of claim 2, wherein the semiconductor optical amplifier includes a III-V semiconductor.

4. The hybrid optical source of claim 3, wherein the reflected wavelength of the optical reflector is tunable.

5. The hybrid optical source of claim 3, wherein the directional coupler includes a multimode interference coupler.

6. The hybrid optical source of claim 3, wherein the optical reflector further includes an MZI between the input port, the output port and the optical loop; and
    wherein the MZI includes the directional coupler at one end of the MZI and a second directional coupler at a second end of the MZI.

7. The hybrid optical source of claim 3, wherein the optical reflector further includes one or more ring-resonator filters in the optical loop.

8. The hybrid optical source of claim 3, wherein the optical reflector further includes one or more ring-resonator filters between the first arm and the input port.

9. A system, comprising:
    a processor;
    memory; and
    an optical integrated circuit that includes an optical device, wherein the optical device includes:
        an optical waveguide configured to convey an optical signal, wherein the optical waveguide includes an optical reflector, and wherein the optical reflector includes:
            an input port optically coupled to a first arm of the optical reflector;
            an output port optically coupled to a second arm of the optical reflector;
            a directional coupler optically coupled to the first arm and the second arm, wherein the directional coupler is configured to evanescently couple the optical signal between the first arm and the second arm; and
            an optical loop optically coupled to the directional coupler, wherein the optical loop includes a third arm and a fourth arm;
        wherein a reflection power coefficient at the input port and a transmission power coefficient at the output port are determined based on coupling power coefficients of the third and the fourth arms.

* * * * *

UNITED STATES PATENT AND TRADEMARK OFFICE
CERTIFICATE OF CORRECTION

PATENT NO. : 9,575,256 B2  
APPLICATION NO. : 15/163591  
DATED : February 21, 2017  
INVENTOR(S) : Li et al.

Page 1 of 1

It is certified that error appears in the above-identified patent and that said Letters Patent is hereby corrected as shown below:

On the Title Page

Column 1, under Inventors, Line 4, delete "San Deigo," and insert -- San Diego, --, therefor.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*